United States Patent
Schmidhammer et al.

(10) Patent No.: US 9,140,733 B2
(45) Date of Patent: Sep. 22, 2015

(54) DETECTOR CIRCUIT

(75) Inventors: Edgar Schmidhammer, Stein an der Traun (DE); Veit Meister, Unterhaching (DE); Gerhard Zeller, Munich (DE)

(73) Assignee: Qualcomm Technologies, Inc., San Diego, CA (US)

( * ) Notice: Subject to any disclaimer, the term of this patent is extended or adjusted under 35 U.S.C. 154(b) by 387 days.

(21) Appl. No.: 13/579,249

(22) PCT Filed: Feb. 18, 2011

(86) PCT No.: PCT/EP2011/052444
§ 371 (c)(1),
(2), (4) Date: Oct. 22, 2012

(87) PCT Pub. No.: WO2011/104191
PCT Pub. Date: Sep. 1, 2011

(65) Prior Publication Data
US 2013/0038387 A1   Feb. 14, 2013

(30) Foreign Application Priority Data
Feb. 24, 2010   (DE) .......................... 10 2010 009 104

(51) Int. Cl.
*G06G 7/12* (2006.01)
*G01R 27/06* (2006.01)

(52) U.S. Cl.
CPC ...................................... *G01R 27/06* (2013.01)

(58) Field of Classification Search
CPC ..................................................... G01R 27/06
USPC .......................................... 324/646; 327/563
See application file for complete search history.

(56) References Cited

U.S. PATENT DOCUMENTS

| | | | | |
|---|---|---|---|---|
| 3,601,717 A | * | 8/1971 | Kuecken | 333/17.1 |
| 4,110,685 A | * | 8/1978 | Leenerts | 324/646 |
| 4,589,103 A | * | 5/1986 | Tajima | 369/44.32 |
| 4,780,661 A | | 10/1988 | Bolomey et al. | |
| 5,059,892 A | * | 10/1991 | Stoft | 324/73.1 |
| 6,236,271 B1 | | 5/2001 | Vakilian | |
| 6,625,428 B1 | * | 9/2003 | Finnell et al. | 455/115.1 |
| 7,397,260 B2 | * | 7/2008 | Chanda et al. | 324/750.03 |
| 7,583,936 B2 | * | 9/2009 | Kovacs et al. | 455/78 |
| 8,660,603 B2 | * | 2/2014 | Block et al. | 455/552.1 |
| 2005/0019879 A1 | * | 1/2005 | Porro et al. | 435/126 |

(Continued)

FOREIGN PATENT DOCUMENTS

DE    196 14 655 B4    3/2007
EP    1 564 896 A1    8/2005

OTHER PUBLICATIONS

Maxim integrated, LF-to-2.5GHz Dual Logarithmic Detector/Controller for Power, Gain, and VSWR Measurements, http://www.maximintegrated.com/en/products/comms/wireless-rf/MAX2016.html (last visited Oct. 3, 2014).*

(Continued)

*Primary Examiner* — Arleen M Vazquez
*Assistant Examiner* — Robert P Alejnikov, Jr.
(74) *Attorney, Agent, or Firm* — Smith Risley Tempel Santos LLC

(57) ABSTRACT

A detector circuit can be used for determining the reflection coefficients of HF signals in a signal path. The detector circuit includes a bidirectional hybrid coupler, logarithmic amplifiers connected to the hybrid couple, and a subtractor having an offset connection.

17 Claims, 5 Drawing Sheets

(56) References Cited

U.S. PATENT DOCUMENTS

| | | | |
|---|---|---|---|
| 2005/0020218 A1* | 1/2005 | Zelley | 455/127.1 |
| 2005/0119879 A1 | 6/2005 | Sung et al. | |
| 2007/0254643 A1* | 11/2007 | Garcia et al. | 455/423 |
| 2008/0211521 A1* | 9/2008 | Lock | 324/696 |
| 2008/0224797 A1* | 9/2008 | Catoiu | 333/115 |
| 2009/0001987 A1* | 1/2009 | Davidsson | 324/347 |
| 2009/0128421 A1* | 5/2009 | Su et al. | 343/700 R |

OTHER PUBLICATIONS

Gerfault, B., et al., "Novel Methodology for Choosing Detectors for Automatic Level Control of High Power Amplifiers," ASID 3$^{rd}$ International Conference on Anti-conterfeiting, Security, and Identification in Communication, Aug. 20-22, 2009, pp. 378-381.

Maxim, "LF-to-2.5 GHz Dual Logarithmic Detector / Controller for Power, Gain, and VSWR Measurements," Maxim Data Sheet MAX2016, 19-3404, Rev. 1, Oct. 2006, 20 pages.

Dostal, J., "Offsetabgleich der Operationsschaltung," Operationsverstärker, Hüthig, XP 002634951, ISBN 3778517872, Jan. 1, 1989, 9 pages.

Pfeiffer, U., et al., "A 20 dBm Fully-Integrated 60 HGz SiGe Power Amplifier With Automatic Level Control," IEEE Journal of Solid State Circuits, vol. 42, No. 7, Jul. 2007, pp. 1455-1463.

International Search Report—PCT/EP2011/052444—ISA/EPO—May 13, 2011.

Written Opinion—PCT/EP2011/052444—ISA/EPO—May 13, 2011.

* cited by examiner

DETECTOR CIRCUIT

This patent application is a national phase filing under section 371 of PCT/EP2011/052444, filed Feb. 18, 2011, which claims the priority of German patent application 10 2010 009 104.9, filed Feb. 24, 2010, each of which is incorporated herein by reference in its entirety.

TECHNICAL FIELD

The invention relates to a detector circuit for determining the reflection coefficient, e.g., in a signal path of a mobile communication device.

BACKGROUND

Modern mobile communication devices comprise an impedance matching circuit for the impedance matching of the impedance of an antenna to the impedance of a signal path or to the impedance of downstream stages of the mobile communication device. In order to be able to effectively match the impedance, it is necessary to determine the actual matching. One measure of the actual matching is the reflection coefficient $\Gamma$ or the voltage standing wave ratio (VSWR), which is dependent on the reflection coefficient. The reflection coefficient $\Gamma$ is the quotient of power propagating in the forward direction and reflected power.

One known detector circuit from Maxim, the circuit MAX 2016, comprises a circulator, via which a reflected signal is coupled out from the signal path and fed to a logarithmic detector. At the same time, the signal propagating in the forward direction is fed to an amplifier via a second logarithmic detector. The respectively logarithmically amplified signals are fed to the two inputs of a subtractor. The subtractor subtracts the logarithmically amplified signals. A logarithmically amplified signal should be understood to mean a signal which is substantially proportional to a logarithm (e.g., the natural algorithm) of the original signal. The difference between logarithmically amplified signals then corresponds—in accordance with the addition theorem of the exponential function—to the quotient of the original signals. The output of the subtractor therefore yields a measure that is substantially proportional to the reflection coefficient $\Gamma$.

SUMMARY OF THE INVENTION

What is problematic about known detector circuits is that the output signals of the logarithmic amplifiers are subjected to noise. The difference between signals subjected to noise likewise comprises the noise. In particular, the error of the sum of two noisy signals is greater than the error in each of the addends.

One major problem in the case of known detector circuits is that the difference signal determined can be negative if the disturbance caused by noise is too large. Analogue-to-digital converters which are intended to digitize the—in this case negative—reflection coefficient and forward it to a logic circuit of the mobile communication device are overtaxed with a negative reflection coefficient.

The quality of the signal specifying the reflection coefficient is greatly dependent on the mobile radio system used. The type of modulation of the mobile radio system greatly influences, in particular, the temporal dependence of the reflection coefficient determined by conventional detector circuits.

In one aspect, the present invention specifies an improved detector circuit.

In a particular aspect, the present invention specifies a detector circuit which functions better with different modulation systems of different mobile radio systems.

The invention specifies a detector circuit for determining the reflection coefficient, comprising a signal port, a load port and a signal path connected therebetween. It furthermore comprises a bidirectional directional coupler, a first and a second logarithmic amplifier, and a subtractor having an offset connection. The directional coupler is connected to the signal path and makes available at a first output a first signal, which is a measure of the power transmitted in the forward direction in the signal path. At a second output, the directional coupler makes available a second signal, which is a measure of the power transmitted counter to the forward direction in the signal path. The first logarithmic amplifier is connected to the first output. The first logarithmic amplifier logarithmically amplifies the first signal. The second logarithmic amplifier is connected to the second output and logarithmically amplifies the second signal. The subtractor is connected to the logarithmic amplifiers and determines the difference from the first logarithmically amplified signal and the second logarithmically amplified signal, wherein the difference constitutes a measure of the reflection coefficient. An offset voltage is present between ground and the offset connection of the subtractor.

A customary subtractor has a first input, a second input, and an output. The second input is an inverted input, compared with the first input. The output is connected to the first input via a resistive element. The voltage between the output of the subtractor and ground is substantially the difference between the voltages of the two inputs. The present subtractor additionally comprises an offset connection. The offset connection is connected to one of the inputs via a further resistive element.

With such a detector circuit it is possible, if a corresponding signal, e.g., a corresponding voltage at the offset connection, is present as an offset voltage, to prevent the voltage at the output of the subtractor from being negative with respect to ground. That is advantageous if the output of the subtractor is directly or indirectly connected to an analogue-to-digital converter that requires a positive input voltage.

Such a detector circuit functions well in the case of RF signals to which a W-CDMA modulation is applied. In particular, it is found that the output voltage at the output of the subtractor of the detector circuit has a temporally smoother, i.e., less noisy, profile compared with conventional detector circuits.

The detector circuit also functions well in the case of different types of modulation. Only a single analogue-to-digital converter is required. The current consumption of the detector circuit is minimized as a result.

In one embodiment, the detector circuit comprises a peak detector, which is connected to the output of the subtractor. The peak detector can comprise a diode connected in series with the subtractor and a capacitive element connected to ground.

In the case of RF signals modulated according to the GSM EDGE modulation method, the temporal fluctuation of the reflection coefficient in the case of conventional detector circuits is so great that even a subsequent, digital temporal averaging of the signal is at best adequate in the case of known detector circuits. By contrast, this configuration of the present detector circuit outputs a reflection coefficient whose temporal profile, even without subsequent processing, has a very smooth progression and is thus subjected to noise to a lesser extent.

The diode of the peak detector can be a Schottky diode.

In one embodiment, the detector circuit comprises an impedance converter, which is connected to the output of the subtractor. Such an impedance converter can match the impedance of the output of the detector circuit to the impedance of downstream circuits. Downstream circuits can be e.g., analogue or digital circuits of a mobile communication device. One of the downstream circuits can be, in particular, an analogue-to-digital converter of a mobile communication device.

In one embodiment, the detector circuit comprises a low-pass filter, which is connected to the output of the subtractor. Such a low-pass filter can suppress high-frequency interference signals which may have been generated, for example, in the noise-generating logarithmic amplifiers.

The low-pass filter can be connected between an impedance converter and the output of the subtractor. It is also possible to connect an impedance converter between a low-pass filter and the output of the subtractor.

In one embodiment, the output of the subtractor is connected to an analogue-to-digital converter of a logic circuit of a mobile communication device.

In one embodiment, the detector circuit comprises a first attenuation element, which is connected between the first output of the directional coupler and the first logarithmic amplifier. The detector circuit then furthermore comprises a second attenuation element, which is connected between the second output of the directional coupler and the second logarithmic amplifier. The two powers tapped off from the directional coupler are then conducted in each case via one of the additional attenuation elements to the respective logarithmic amplifiers. The attenuation elements support the level matching and the impedance matching between the directional coupler and the logarithmic amplifiers. Pi- or T-circuits are appropriate as attenuation elements.

In one embodiment, the detector circuit comprises an impedance converter, which is connected to the output of the subtractor and additionally constitutes a low-pass filter. By virtue of the fact that the function of impedance conversion and the low-pass filter function are integrated in one subcircuit, a second additional low-pass filter circuit is avoided, as a result of which costs and space are saved.

In one embodiment, the detector circuit is designed such that the bidirectional directional coupler and the remaining components of the detector circuit can process frequencies of 400 MHz to 3000 MHz.

In particular, the components are designed such that they can process the customary GSM and (W-)CDMA frequencies.

In one embodiment, the detector circuit is designed for processing signals of the mobile radio systems GSM, W-CDMA, LTE and OFDM.

In one embodiment, the detector circuit is designed for processing signals of the mobile radio systems WLAN and WiMAX.

In one embodiment, the detector circuit comprises an active electrical component, a passive electrical component and a multilayer substrate, wherein the active electrical component is arranged on the surface of the substrate, and the passive electrical component is realized by metalized interlayers of the substrate and is therefore arranged substantially in the interior of the substrate. In particular, one of the two or both logarithmic amplifiers can in each case be the stated active electrical circuit component.

In one embodiment, the detector circuit is realized in a module having a base area of less than 25 mm$^2$.

In one embodiment, the detector circuit comprises an RF shield for shielding the components of the detector circuit from external RF signals. However, the RF shield also protects further circuit components against RF signals emitted by the detector circuit.

In one embodiment, the detector circuit is arranged in a tunable module. A tunable module is a module which comprises tunable circuit elements, e.g., elements having variable capacitance, variable inductance or variable resistivity.

In one embodiment, the detector circuit is connected in a signal path of a mobile communication device. The signals of the detector circuit are used for the open-loop or closed-loop control of a power amplifier or of an impedance matching circuit. A tunable module comprising a detector circuit can furthermore comprise a logic circuit. The logic circuit controls the values of the tunable circuit elements on the basis of the measure of the reflection coefficient as measured by the detector circuit. A possibility of dynamically matching the impedance of a signal path of a mobile communication device is thus afforded.

The first resistive element and the second resistive element can determine the ratio of the potentials at the first output and the output of the subtractor circuit. The resistances of the resistive elements are then determined such that the temporally different potentials at the output can be digitized well by the analogue-to-digital converter.

The resistances of the third and fourth resistive elements are dependent on the values of the first, second and fifth resistive elements:

$$R_3 = \frac{R_1 R_5}{R_2} v_{U0}, \quad R_4 = R_5 \frac{v_{U0}}{1 - v_{U0}}.$$

In this case, $v_{U0}$ is a number between zero and one which determines the offset voltage present at the offset connection. By way of example, $v_{U0}$ can be 0.68.

The resistance of the fifth resistive element is a parameter with which the electrical behavior of the subtractor can be matched to the rest of the circuit components.

The ohmic resistance of the first resistive element can be between 40 and 55 k$\Omega$. The ohmic resistance of the second resistive element R2 can be between 90 and 110 k$\Omega$. The ohmic resistance of the third resistive element R3 can be between 30 and 45 k$\Omega$. The ohmic resistance of the fourth resistive element R4 can be between 250 and 300 k$\Omega$. The ohmic resistance of the fifth resistive element R5 can be between 110 and 130 k$\Omega$. The offset voltage present between the offset connection and ground can be between 2 and 3 V.

In one embodiment, the ohmic resistance of the first resistive element R1 is 47 k$\Omega$, the resistance of the second resistive element R2 is 100 k$\Omega$, the resistance of the third resistive element R3 is 39 k$\Omega$, the resistance of the fourth resistive element R4 is 270 k$\Omega$ and the resistance of the fifth resistive element R5 is 120 k$\Omega$. In one embodiment, the offset voltage is 2.7 V.

BRIEF DESCRIPTION OF THE DRAWINGS

The detector circuit is explained in greater detail below on the basis of exemplary embodiments and associated schematic figures, in which.

DETAILED DESCRIPTION OF ILLUSTRATIVE EMBODIMENTS

Figure 1:
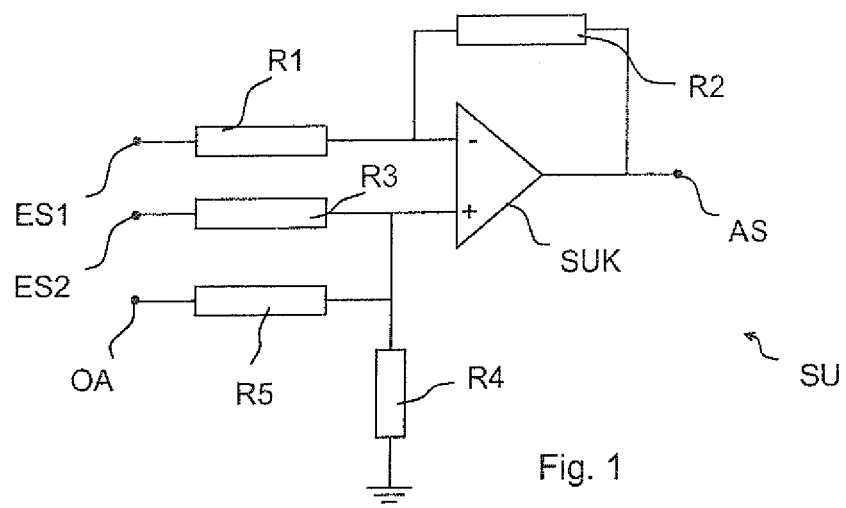
FIG. 1 shows one configuration of the subtractor.

FIG. 1 shows one configuration of the subtractor SU having an offset connection OA. The subtractor SU comprises a conventional subtracting circuit SUK. The conventional subtracting circuit SUK comprises a first input (identified by "−") and a second input (identified by "+") and also an output AS. The subtractor SU comprises a first input ES1 and a second input ES2. The first input ES1 of the subtractor is connected to the input of the conventional subtracting circuit. The second input ES2 of the subtractor is connected to the second input of the conventional subtracting circuit SUK. A first resistive element R1 is connected between the first input ES1 of the subtractor SU and the first input of the conventional subtracting circuit SUK ("−"). A third resistive element R3 is connected between the second input ES2 of the subtractor SU and the second input of the conventional subtracting circuit SUK ("+"). A second resistive element R2 is connected between the output of the subtractor SU, which corresponds to the output AS of the conventional subtracting circuit SUK, and the input of the conventional subtracting circuit SUK ("−"). The offset connection OA of the subtractor SU is connected to the second input ("+") of the conventional subtracting circuit SUK. A fifth resistive element R5 is connected between the offset input OA of the subtractor SU and the second input of the conventional subtracting circuit SUK ("+"). A fourth resistive element R4 is connected, in parallel with the resistive element R5, between the second input of the conventional subtracting circuit SUK ("+") and ground.

The subtractor SU shown can output, at its output AS, a voltage relative to ground which is a measure of the difference between the input voltages at the input connections ES1 and ES2. Depending on what offset voltage is applied to the offset connection OA relative to ground, the voltage indicating the difference can be corrected by the offset.

Figure 2:
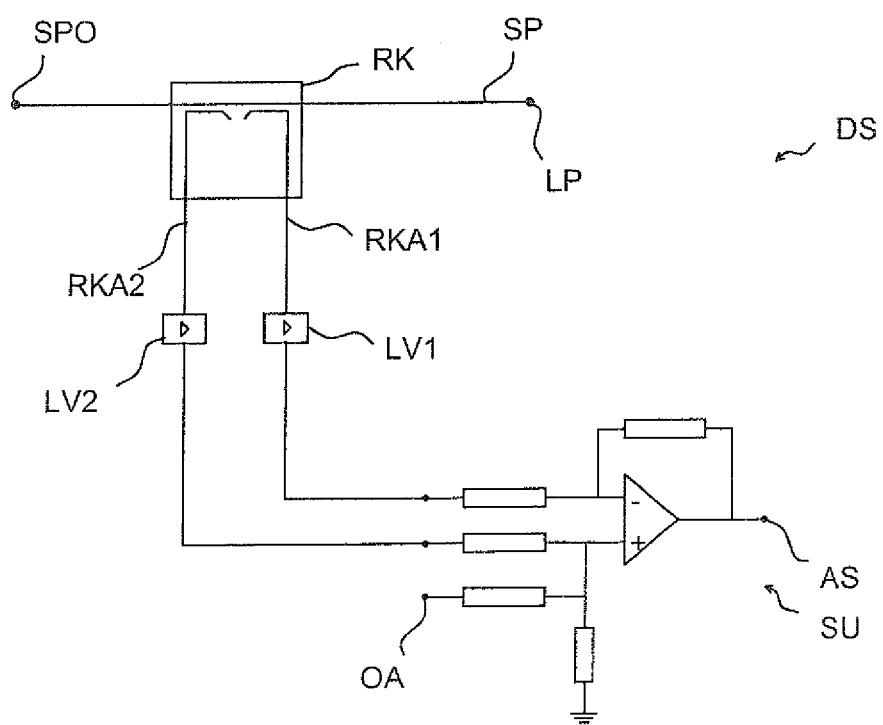
FIG. 2 shows a basic form of the detector circuit.

FIG. 2 shows a basic form of the detector circuit DS comprising a signal path SP between a signal port SPO and a load port LP. A bidirectional directional coupler RK is connected in the signal path, which can be a signal path of a mobile communication device. The bidirectional directional coupler RK has a first output RKA1 and a second output RKA2. A first logarithmic amplifier LV1 is connected to the first output RKA1 of the directional coupler RK. A second logarithmic amplifier LV2 is connected to the second output RKA2 of the directional coupler RK. The logarithmic amplifiers LV1, LV2 are in each case connected to exactly one input ES1, ES2 of the subtractor SU. The subtractor SU makes available at its output AS a time-dependent voltage that is substantially proportional to the reflection coefficient of RF signals propagating in the signal path SP and that can be altered by an offset voltage present at the offset connection OA of the subtractor.

Figure 3:
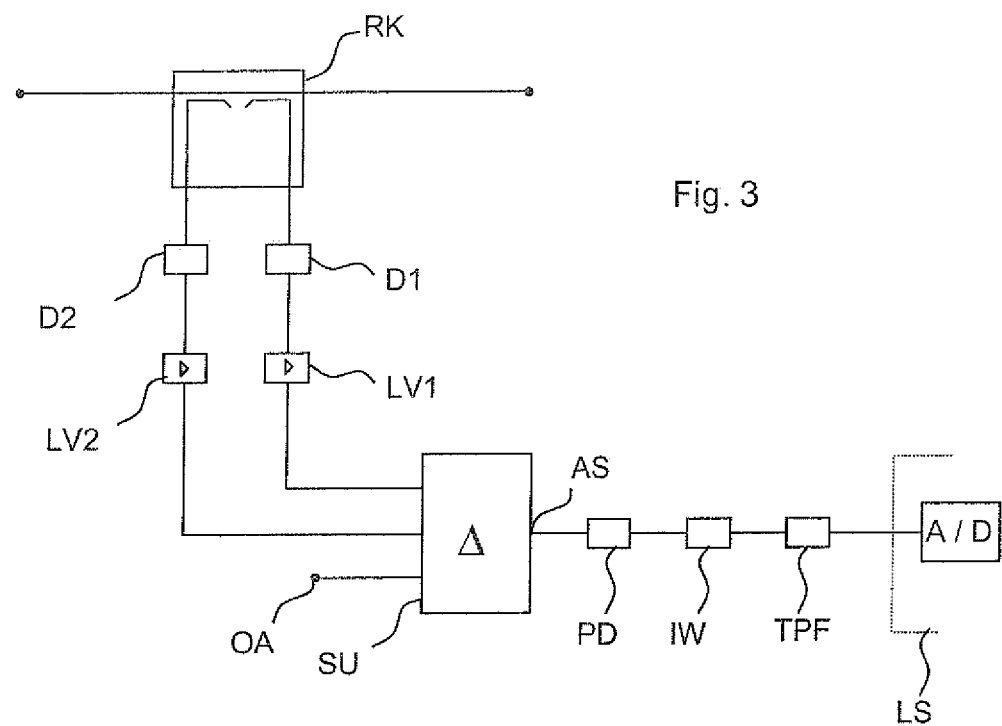
FIG. 3 shows a detector circuit comprising attenuation elements, a peak detector, an impedance converter and a low-pass filter.

FIG. 3 shows a configuration of the detector circuit shown in FIG. 2, wherein a first attenuation element D1 is connected between the first output of the directional coupler RK and the first logarithmic amplifier LV1. A second attenuation element D2 is connected between the second output of the directional coupler and the second logarithmic amplifier LV2.

The output AS of the subtractor SU is connected to an analogue-to-digital converter A/D of a logic circuit LS. A peak detector PD, an impedance converter IW and a low-pass filter TPF are connected between the output of the subtractor and the analogue-to-digital converter. In this case, the peak detector is connected between the output of the subtractor and the impedance converter. The low-pass filter TPF is connected between the impedance converter and the analogue-to-digital converter A/D.

Figure 4:
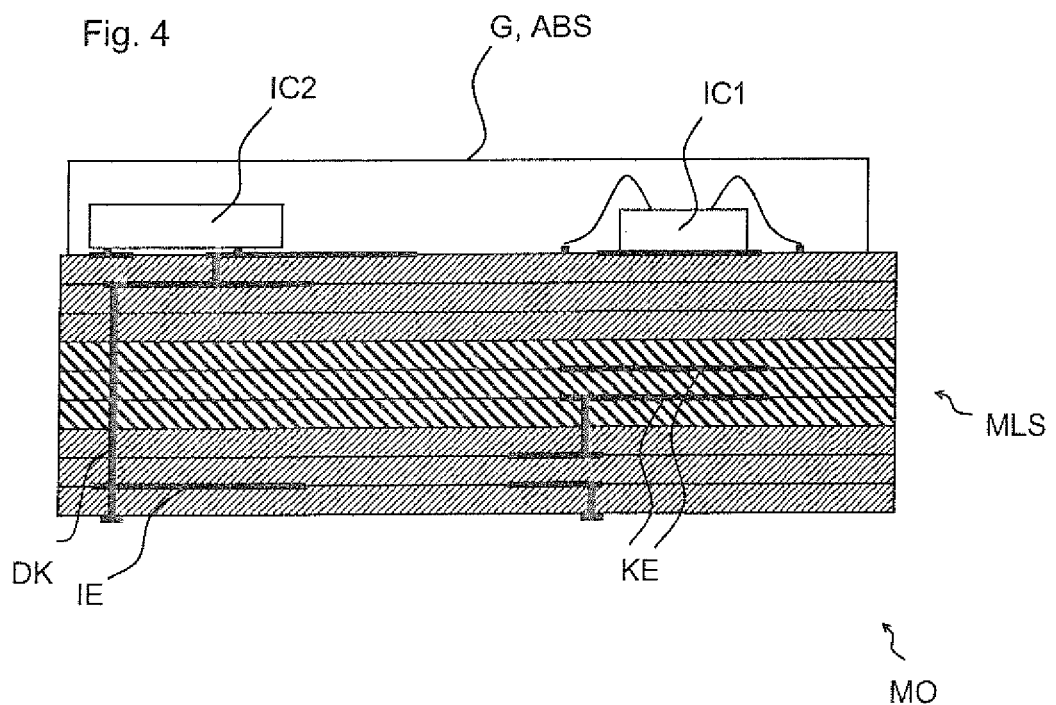
FIG. 4 shows a configuration in which the detector circuit comprises discrete components and integrated circuit components within a multilayer substrate.

FIG. 4 shows how different discrete and integrated circuit elements of the detector circuit can be combined to form a module MO and arranged on the surface or in interlayers of a multilayer substrate MLS. One discrete circuit component IC1, which can comprise active circuit components, for example, is arranged on the surface of the multilayer substrate MLS and connected via bonding wires to connection pads on the surface of the multilayer substrate. Alternatively or additionally, it is possible to accommodate circuit components in a component IC2 arranged in flip-chip design on the surface of the multilayer substrate MLS. The circuit components of the discrete component IC2 are connected via bumps to the interconnection on the surface and in the interior of the multilayer substrate MLS. The multilayer substrate MLS comprises at least two dielectric layers. Passive circuit components, e.g., capacitive elements KE or inductive elements IE, can be arranged in metallization planes between the dielectric layers of the multilayer substrate MLS. Different metallization planes can be connected to one another via plated-through holes DK. A housing or a covering G can cover discrete components or conductor structures on the surface of the multilayer substrate MLS and protect them against mechanical action, dust or moisture. The covering or the housing G can constitute an RF shield ABS that protects the circuit components of the detector circuit against interfering RF signals acting from outside. Conversely or additionally, the RF shield can protect components situated in the spatial vicinity against interfering RF signals emitted by circuit components of the detector circuit.

Figure 5:
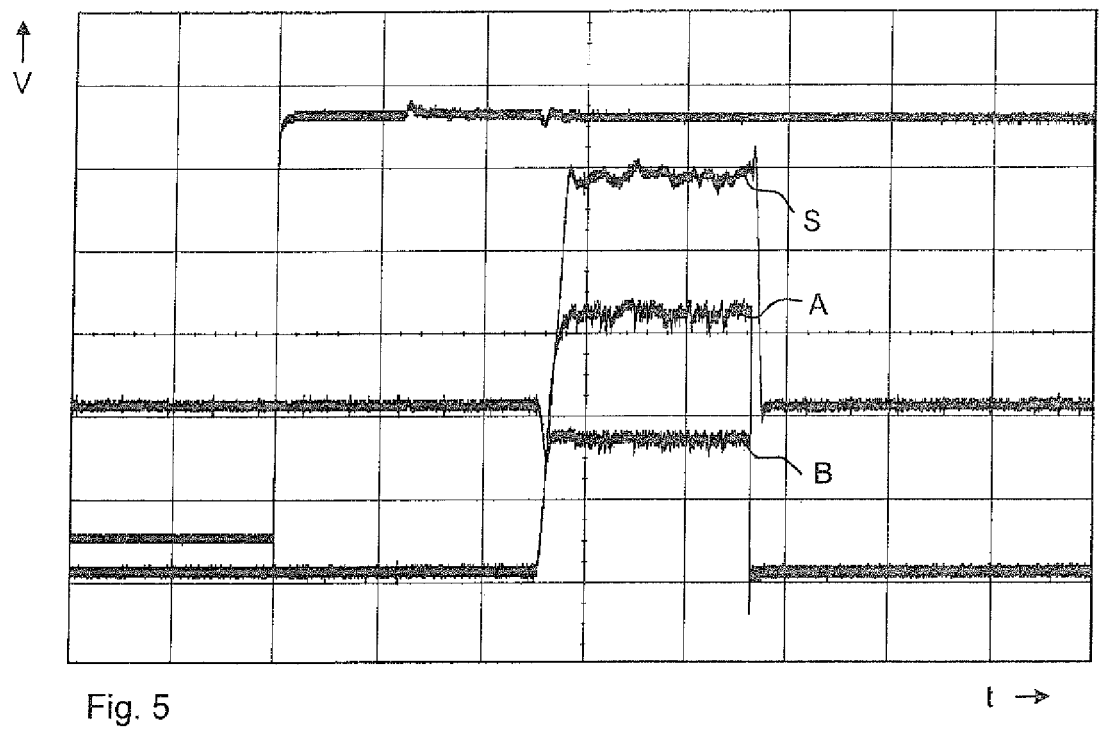
FIG. 5 shows the voltage profile at the signal output of a subtractor of a conventional detector circuit.

FIG. 5 shows for a conventional detector circuit: the temporal profile of the voltage A present at the output of the first logarithmic amplifier LV1, the temporal profile of the voltage B present at the output of the second logarithmic amplifier LV2, and the temporal profile S of the absolute value of the voltage at the output of the subtractor SU, which is a measure of the reflection coefficient Γ. The fact that the reflection coefficient is subjected to noise can clearly be seen.

Figure 6:
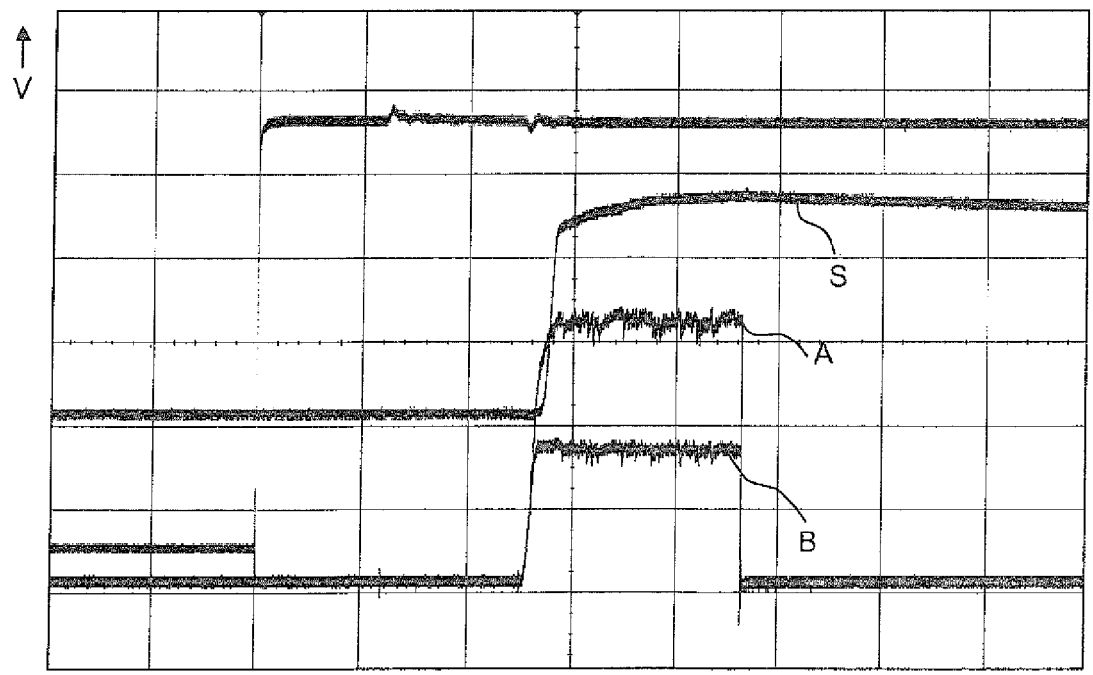
FIG. 6 shows temporal voltage profiles of a conventional detector circuit.

In contrast thereto, FIG. 6 shows the corresponding curves A, B, S, but from a detector circuit according to the invention including a peak detector, which is connected to the output AS of the subtractor. The signals A, B at the outputs of the logarithmic amplifiers LV1, LV2 have noise comparable to FIG. 5. By contrast, the reflection coefficient S determined exhibits a significantly smoother profile with significantly reduced noise.

Figure 7:
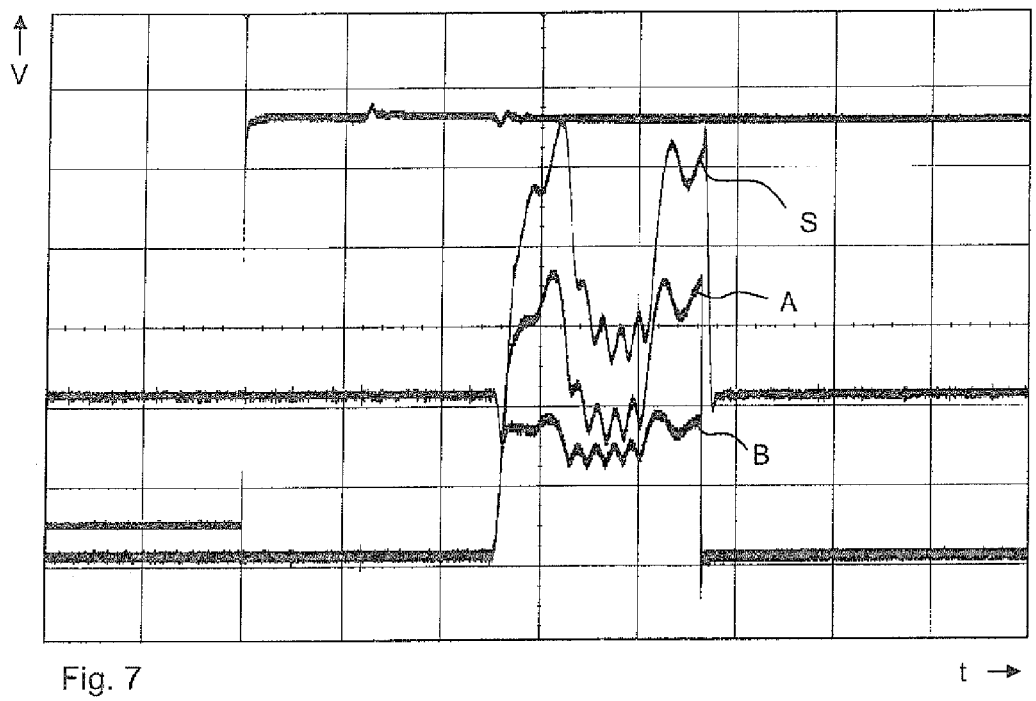
FIG. 7 shows temporal voltage profiles of a detector circuit comprising a peak detector.

FIG. 7 shows the temporal profiles A, B, S of a conventional detector circuit directly at the output of the subtractor SU, while a particularly critical GSM EDGE signal is modulated. The fact that the reflection coefficient S fluctuates extremely greatly can clearly be seen.

Figure 8:
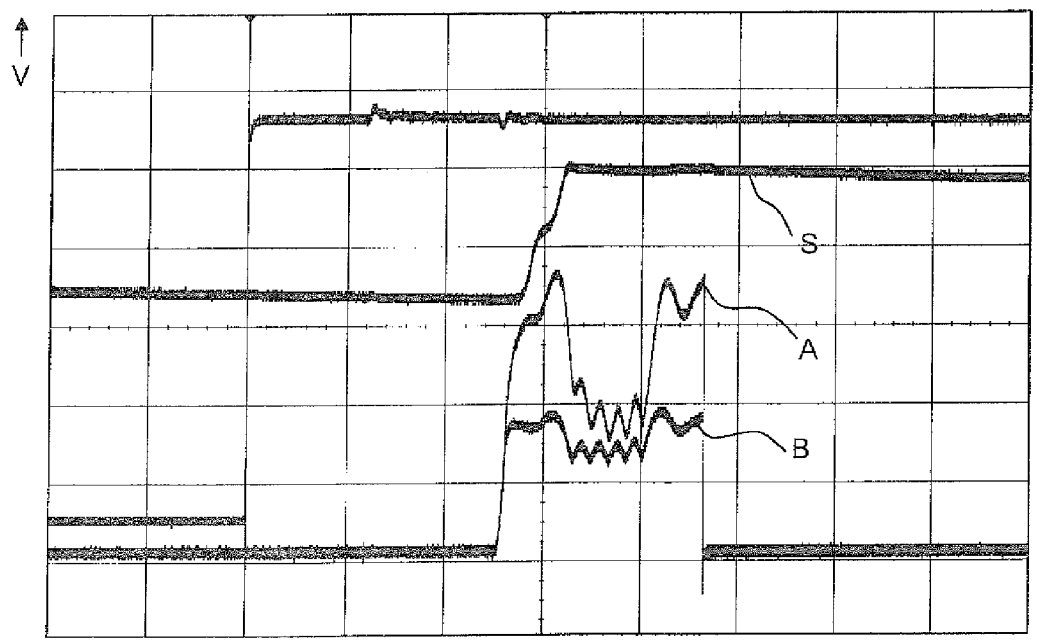
FIG. 8 shows temporal voltage profiles of a conventional detector circuit in the case of modulated GSM EDGE signals.

FIG. 8 shows the temporal profiles A, B, S for a modulated GSM EDGE signal when the detector circuit according to the invention is used, wherein a peak detector PD is connected to the output AS of the subtractor. Here, too, a profile of the signal S output at the output AS of the detector circuit is manifested which is significantly smoother and has significantly reduced noise.

Figure 9:
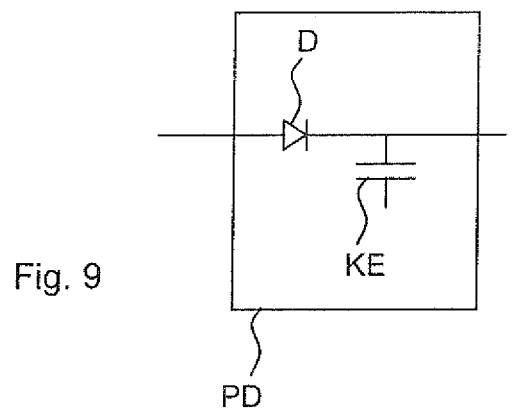
FIG. 9 shows temporal voltage profiles of a detector circuit comprising a peak detector in the case of modulated GSM EDGE signals.

FIG. 9 shows a configuration of the peak detector PD comprising a diode D and a capacitive element KE, one electrode of which is connected to an electrode of the diode D.

Figure 10:
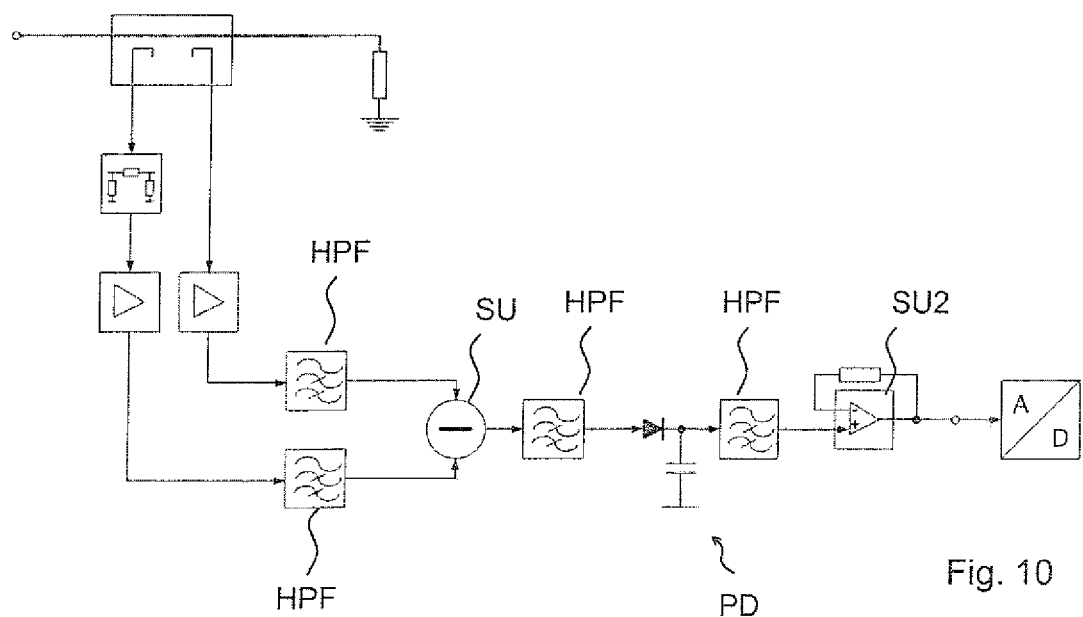
FIG. 10 shows a further configuration of a detector circuit.

FIG. 10 shows a configuration of the detector circuit comprising a respective high-pass filter HPF respectively connected between one of the logarithmic amplifiers and one of the inputs of the subtractor SU. A respective further high-pass filter HPF is connected between the subtractor SU and the peak detector PD, and between the peak detector PD and the analogue-to-digital converter. A further subtractor is connected between the high-pass filter connected downstream of the peak detector and the analogue-to-digital converter. In this case, the high-pass filter is connected to the non-inverted input of the further subtractor SU2. The output of the further subtractor SU2 is connected to the inverted input of the further subtractor SU2 and to the analogue-to-digital converter.

Such an interconnection with further filters improves the impedance matching between the circuit elements of the detector circuit. Furthermore, a good functioning of the peak detector is fostered thereby.

A detector circuit is not restricted to one of the exemplary embodiments described. Variations comprising e.g., even further high-pass or low-pass filters or further resistive elements likewise constitute exemplary embodiments according to the invention.

The invention claimed is:

1. A detector circuit for determining a reflection coefficient, the detector circuit comprising:
    a signal port;
    a load port;
    a signal path coupled between the signal port and the load port;
    a bidirectional directional coupler, wherein the bidirectional directional coupler is connected to the signal path and makes a first signal available at a first output, the first signal comprising a measure of power transmitted in a forward direction in the signal path, the bidirectional directional coupler making a second signal available at a second output, the second signal comprising a measure of power transmitted counter to the forward direction in the signal path;
    a first logarithmic amplifier, wherein the first logarithmic amplifier is coupled to the first output and is configured to logarithmically amplify the first signal;
    a second logarithmic amplifier, wherein the second logarithmic amplifier is coupled to the second output and is configured to logarithmically amplify the second signal; and
    a subtractor comprising a differential amplifier and having an offset connection provided through a resistance coupled to a first differential input of the differential amplifier, wherein the first differential input of the differential amplifier is coupled to an output of the first logarithmic amplifier, and a second differential input of the differential amplifier is coupled to an output of the second logarithmic amplifier, wherein the subtractor is configured to determine a difference from the first logarithmically amplified signal and the second logarithmically amplified signal as a measure of the reflection coefficient, and wherein an offset voltage is present between ground and the offset connection of the subtractor.

2. The detector circuit according to claim 1, further comprising a peak detector, which is coupled to an output of the subtractor.

3. The detector circuit according to claim 2, wherein the peak detector comprises a diode coupled in series with the subtractor and a capacitive element that is connected to ground.

4. The detector circuit according to claim 3, wherein the diode is a Schottky diode.

5. The detector circuit according to claim 1, further comprising an impedance converter, which is coupled to an output of the subtractor.

6. The detector circuit according to claim 1, further comprising a low pass filter, which is coupled to an output of the subtractor.

7. The detector circuit according to claim 1, wherein an output of the subtractor is coupled to an analog-to-digital converter of a logic circuit of a mobile communication device.

8. The detector circuit according to claim 1, further comprising:
    a first attenuation element, which is coupled between the first output of the bidirectional directional coupler and the first logarithmic amplifier; and
    a second attenuation element, which is coupled between the second output of the bidirectional directional coupler and the second logarithmic amplifier.

9. The detector circuit according to claim 1, further comprising an impedance converter, which is coupled to an output of the subtractor and serves as a low pass filter.

10. The detector circuit according to claim 1, wherein the bidirectional directional coupler is configured to process signals at frequencies of 400 MHz to 3000 MHz.

11. The detector circuit according to claim 1, wherein the detector circuit is configured to process signals of a mobile radio system selected from the group consisting of GSM, W CDMA, LTE and OFDM.

12. The detector circuit according to claim 1, wherein the detector circuit is configured to process signals of a WLAN or WIMAX communication system.

13. The detector circuit according to claim 1, further comprising:
    a multilayer substrate;
    an active electrical component arranged on a surface of the multilayer substrate; and
    a passive electrical component arranged in metalized interlayers of the multilayer substrate.

14. The detector circuit according to claim 1, wherein the detector circuit is realized in a module having a base area of less than 25 $mm^2$.

15. The detector circuit according to claim 1, wherein the detector circuit comprises an RF shield.

16. The detector circuit according to claim 1, wherein the detector circuit is arranged in a tunable module.

17. The detector circuit according to claim 1, wherein the detector circuit is coupled in a signal path of a mobile communication device and wherein the detector circuit is configured to provide open loop or closed loop control of a power amplifier or of an impedance matching circuit.

* * * * *